(12) United States Patent
Jeon

(10) Patent No.: US 9,166,203 B2
(45) Date of Patent: Oct. 20, 2015

(54) METHOD OF A FABRICATING DISPLAY SUBSTRATE AND METHOD OF FABRICATING A DISPLAY DEVICE USING THE SAME

(71) Applicant: SAMSUNG DISPLAY CO., LTD., Yongin, Gyeonggi-Do (KR)

(72) Inventor: Woo-Seok Jeon, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/299,168

(22) Filed: Jun. 9, 2014

(65) Prior Publication Data

US 2015/0171377 A1 Jun. 18, 2015

(30) Foreign Application Priority Data

Dec. 16, 2013 (KR) ........................ 10-2013-0156533

(51) Int. Cl.
| | |
|---|---|
| H01L 21/00 | (2006.01) |
| H01L 51/56 | (2006.01) |
| H01L 27/32 | (2006.01) |
| H01L 27/12 | (2006.01) |
| H01L 21/4763 | (2006.01) |
| H01L 29/66 | (2006.01) |
| H01L 21/033 | (2006.01) |

(52) U.S. Cl.
CPC ............ *H01L 51/56* (2013.01); *H01L 21/0337* (2013.01); *H01L 21/47635* (2013.01); *H01L 27/1259* (2013.01); *H01L 27/3232* (2013.01); *H01L 29/66969* (2013.01); *H01L 2227/323* (2013.01)

(58) Field of Classification Search
USPC .............. 438/23, 22, 141, 142, 153, 154, 478
See application file for complete search history.

(56) References Cited

U.S. PATENT DOCUMENTS

| | | | |
|---|---|---|---|
| 7,579,137 | B2 | 8/2009 | Colburn et al. |
| 2009/0253080 | A1 | 10/2009 | Dammel et al. |

FOREIGN PATENT DOCUMENTS

| | | |
|---|---|---|
| JP | 08-139073 | 5/1996 |
| KR | 1020020029240 | 4/2002 |
| KR | 1020060001333 | 1/2006 |
| KR | 1020060077008 | 7/2006 |

*Primary Examiner* — Timor Karimy
(74) *Attorney, Agent, or Firm* — F. Chau & Associates, LLC

(57) ABSTRACT

A method of fabricating a display substrate includes forming a gate electrode on a substrate, forming a gate insulating layer to cover the gate electrode, forming an active layer on the gate insulating layer, forming a metal layer on the active layer, forming a first mask pattern on the metal layer to face a first region of the active layer, forming a second mask pattern on the metal layer to face a second region and a third region of the active layer, etching the metal layer and the active layer using the first and second mask patterns as an etch mask to form a metal pattern and an active pattern, removing the first mask pattern, and etching the metal pattern using the second mask pattern as an etch mask to form a source electrode and a drain electrode.

20 Claims, 7 Drawing Sheets

METHOD OF A FABRICATING DISPLAY SUBSTRATE AND METHOD OF FABRICATING A DISPLAY DEVICE USING THE SAME

CROSS-REFERENCE TO RELATED APPLICATIONS

This patent application claims priority under 35 U.S.C. §119 to Korean Patent Application No. 10-2013-0156533, filed on Dec. 16, 2013, the disclosure of which is hereby incorporated by reference herein in its entirety.

(i) TECHNICAL FIELD

Example embodiments of the inventive concept relate to a method of fabricating a display substrate and a method of fabricating a display device using the same, and in particular, to a method of fabricating a thin-film transistor of a display substrate and a method of fabricating a display device using the same.

(ii) DISCUSSION OF THE RELATED ART

A variety of flat-panel display devices, such as, for example, a liquid crystal display, a field emission display, a plasma display panel, and an organic electroluminescent display, have been developed. The flat-panel display device may include a plurality of thin-film transistors and a display substrate including pixels, which are electrically connected to the thin-film transistors, respectively. Each of the thin-film transistors is configured to perform a switching operation for a data signal to be applied to a corresponding one of the pixels.

In general, to realize the thin-film transistors, gate electrodes, active patterns, and source electrodes, and drain electrodes may be formed on a substrate.

SUMMARY

Example embodiments of the inventive concept provide a method capable of relatively easily forming thin-film transistors on a display substrate.

Example embodiments of the inventive concept provide a method of utilizing the display substrate to fabricate a display device with ease.

According to example embodiments of the inventive concept, a method of fabricating a display substrate may include forming a gate electrode on a substrate, forming a gate insulating layer to cover the gate electrode, forming an active layer on the gate insulating layer, forming a metal layer on the active layer, forming a first mask pattern on the metal layer to face a first region of the active layer, forming a second mask pattern on the metal layer to face a second region and a third region of the active layer, etching the metal layer and the active layer using the first and second mask patterns as an etch mask to form a metal pattern and an active pattern, removing the first mask pattern, and etching the metal pattern using the second mask pattern as an etch mask to form a source electrode and a drain electrode.

In example embodiments, the second mask pattern may be formed after the first mask pattern is formed, and the forming of the second mask pattern may include forming a first photosensitive film to cover the first mask pattern, exposing the first photosensitive film with a binary mask including an optically-transparent region and a light-blocking region, and developing the exposed first photosensitive film using a developing solution. The first mask pattern and the first photosensitive film are formed of different materials from each other, such that the first mask pattern is prevented from being developed by the developing solution in the developing of the exposed first photosensitive film.

In example embodiments, the first mask pattern may be formed using a printing process.

In example embodiments, a profile angle between a side surface of the second mask pattern and the substrate may be an acute angle of no less than 50 degrees, when viewed in sectional view.

In example embodiments, one of the first and second mask patterns may be formed of a negative photosensitive material and the other of the first and second mask patterns may be formed of a positive photosensitive material.

In example embodiments, the first mask pattern and the second mask pattern are formed of the same material as each other, and the method further includes curing the first mask pattern to make a difference in ashing rate between the first and second mask patterns.

In example embodiments, the second mask pattern may be formed to be thicker than the first mask pattern.

In example embodiments, the first mask pattern may be formed after the second mask pattern is formed, and the forming of the second mask pattern may include forming a first photosensitive film on the substrate provided with the metal layer, exposing the first photosensitive film with a binary mask including an optically-transparent region and a light-blocking region, and developing the exposed first photosensitive film using a developing solution.

According to example embodiments of the inventive concept, a method of fabricating a display device may include forming a display substrate, and combining a counter substrate to the display substrate. The forming of the display substrate may include forming a gate electrode on a substrate, forming a gate insulating layer to cover the gate electrode, forming an active layer on the gate insulating layer, forming a metal layer on the active layer, forming a first mask pattern on the metal layer to face a first region of the active layer, forming a second mask pattern on the metal layer to face a second region and a third region of the active layer, etching the metal layer and the active layer using the first and second mask patterns as an etch mask to form a metal pattern and an active pattern, removing the first mask pattern, etching the metal pattern using the second mask pattern as an etch mask to form a source electrode and a drain electrode, and forming a pixel portion electrically connected to a thin-film transistor including the gate electrode, the active pattern, the source electrode, and the drain electrode.

In example embodiments, the second mask pattern may be formed after the first mask pattern is formed, and the forming of the second mask pattern may include forming a first photosensitive film to cover the first mask pattern, exposing the first photosensitive film with a binary mask including an optically-transparent region and a light-blocking region, and developing the exposed first photosensitive film using a developing solution. The first mask pattern and the first photosensitive film are formed of different materials from each other, such that the first mask pattern is prevented from being developed by the developing solution in the developing of the exposed first photosensitive film.

In example embodiments, the first mask pattern may be formed using a printing process.

In example embodiments, a profile angle between a side surface of the second mask pattern and the substrate may be an acute angle of no less than 50 degrees, when viewed in sectional view.

In example embodiments, one of the first and second mask patterns may be formed of a negative photosensitive material and the other of the first and second mask patterns is formed of a positive photosensitive material.

In example embodiments, the first mask pattern and the second mask pattern are formed of the same material, and the method further includes curing the first mask pattern to make a difference in ashing rate between the first and second mask patterns.

In example embodiments, the second mask pattern may be formed to be thicker than the first mask pattern.

In example embodiments, the first mask pattern may be formed after the second mask pattern is formed, and the forming of the second mask pattern may include forming a first photosensitive film on the substrate provided with the metal layer, exposing the first photosensitive film with a binary mask including an optically-transparent region and a light-blocking region, and developing the exposed first photosensitive film using a developing solution.

In example embodiments, the method may further include forming a liquid crystal layer between the display and counter substrates. The forming of the pixel portion includes forming a pixel electrode electrically connected to the thin-film transistor.

In example embodiments, the forming of the pixel portion may include forming a first electrode electrically connected to the thin-film transistor, forming an organic light-emitting layer on the first electrode, and forming a second electrode on the organic light-emitting layer.

According to example embodiments of the inventive concept, a method of fabricating a display substrate is provided. The method includes forming a gate electrode on a substrate, forming a gate insulating layer to cover the gate electrode, forming an active layer having a first region, a second region and a third region on the gate insulating layer, forming a metal layer on the active layer, forming a first mask pattern on the metal layer to face the first region of the active layer using a printing process, forming a second mask pattern having a first thickness on the metal layer to face the second region and the third region of the active layer, in which a profile angle between a side surface of the second mask pattern and the substrate is an acute angle of no less than 50 degrees, when viewed in sectional view, and etching the metal layer and the active layer using the first and second mask pattern as an etch mask to form a metal pattern and an active pattern on the first region, the second region and the third region. The active pattern includes a provisional channel region having a first channel length.

In addition, the method includes removing the first mask pattern thereby exposing a portion of the metal pattern on the first region, and etching the metal pattern using the second mask pattern as an etch mask to form a source electrode and a drain electrode. The etched second mask pattern has a second thickness smaller than the first thickness, and as a result of the etching of the metal pattern, the active pattern includes a channel region having a second channel length which is greater than the first channel length.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1A:
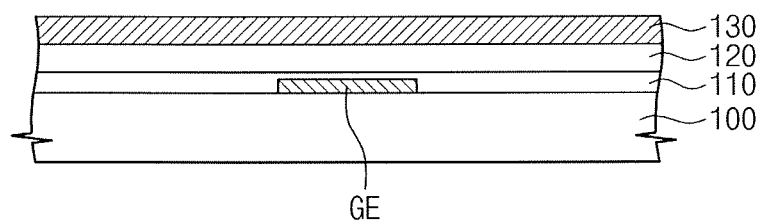
FIGS. 1A through 1G are sectional views illustrating a method of fabricating a display substrate, according to an example embodiment of the inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to embodiments set forth herein. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

FIGS. 1A through 1G are sectional views illustrating a method of fabricating a display substrate, according to an example embodiment of the inventive concept.

Referring to FIG. 1A, a gate electrode GE may be formed on a substrate 100.

In an example embodiment, the formation of the gate electrode GE may include forming a metal layer on the substrate 100 and then pattering the metal layer. After the formation of the gate electrode GE, a gate insulating layer 110 may be formed to cover the gate electrode GE. After the formation of the gate insulating layer 110, an active layer 120 may be formed on the gate insulating layer 110, and a metal layer 130 may be formed on the active layer 120.

The substrate 100 may be made of, for example, transparent glass, quartz, plastic, or the like. Further, in an exemplary embodiment, the substrate 100 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The gate insulating layer 110 may be made of, for example, silicon nitride (SiNx), silicon oxide (SiOx), silicon oxynitride (SiOxNy), aluminum oxide (AlOx), yttrium oxide ($Y_2O_3$), hafnium oxide (HfOx), zirconium oxide (ZrOx), aluminum nitride (AlN), aluminum oxynitride (AlNo), titanium oxide (TiOx), barium titanate (BaTiO3), lead titanate ($PbTiO_3$), or a combination thereof.

In an example embodiment, the active layer 120 may include, for example, an oxide semiconductor including indium-gallium-zinc oxide (IGZO). However, the material for the active layer 120 may not be limited thereto, and for example, the active layer 120 may include at least one of oxide semiconductors, such as zinc oxide (ZnO), tin oxide ($SnO_2$), indium oxide ($In_2O_3$), zinc tin oxide ($Zn_2SnO_4$), germanium oxide ($Ge_2O_3$), and hafnium oxide ($HfO_2$). Alternatively, in an embodiment, the active layer 120 may include, for example, a compound semiconductor, such as gallium arsenide (GaAs), gallium phosphide (GaP), and indium phosphide (InP). In addition, in an embodiment, the active layer 120 may alternatively include, for example, amorphous silicon.

The metal layer 130 may be formed of or include, for example, at least one of metals (e.g., chromium, aluminum, tantalum, molybdenum, titanium, tungsten, copper, silver, and so forth), or any alloy thereof. Further, in an example embodiment, the metal layer 130 may be formed to have, for example, a single-layered structure. However, alternatively in an embodiment, the metal layer 130 may be formed to include, for example, a plurality of stacked metal layers, at least one of which is different from the other.

Figure 1B:
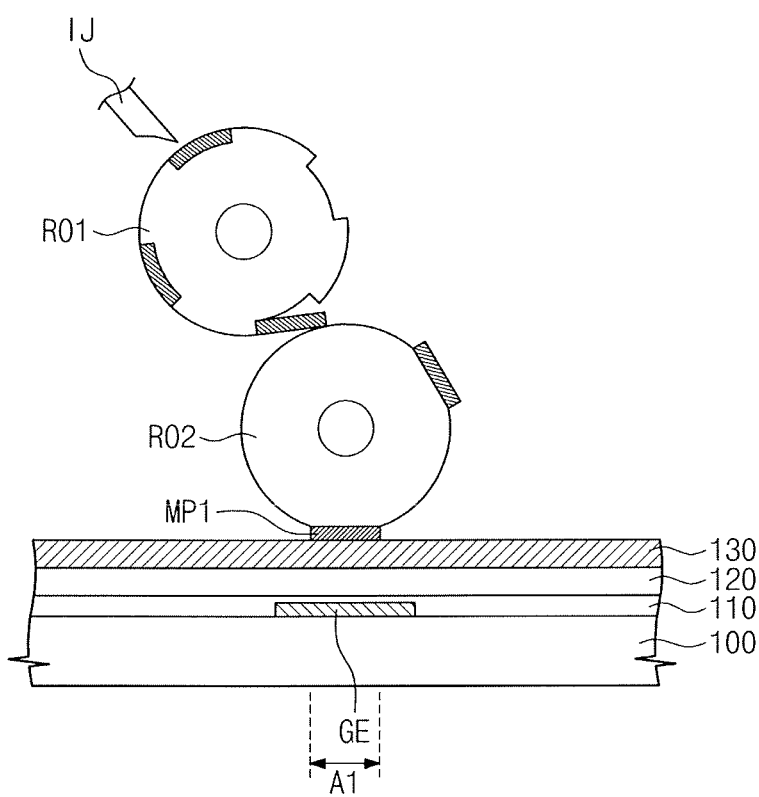

Referring to FIG. 1B, a first mask pattern MP1 may be formed on the metal layer 130. The first mask pattern MP1 may be formed on a portion of the metal layer 130 positioned to face a first region A1 of the active layer 120.

In an example embodiment, the first mask pattern MP1 may be formed using, for example, a printing process. For example, the first mask pattern MP1 may be formed using a printing system including an ink supplying device IJ, a gravure roll RO1, and a blanket roll RO2. In the printing process, ink may be supplied from the ink supplying device IJ to the gravure roll RO1 with dents or grooves, be copied from the gravure roll RO1 to the blanket roll RO2 by a rolling of the gravure roll RO1, and then, be copied from the blanket roll RO2 onto the metal layer 130 by a rolling of the blanket roll RO2. The first mask pattern MP1 may be formed of the ink copied or transferred to the metal layer 130.

As described above, the first mask pattern MP1 can be formed by the printing process using the gravure roll RO1 and the blanket roll RO2, but example embodiments of the inventive concept may not be limited thereto. For example, alternatively in an example embodiment, a printing process using an inkjet system may be used to form the first mask pattern MP1.

Figure 1C:
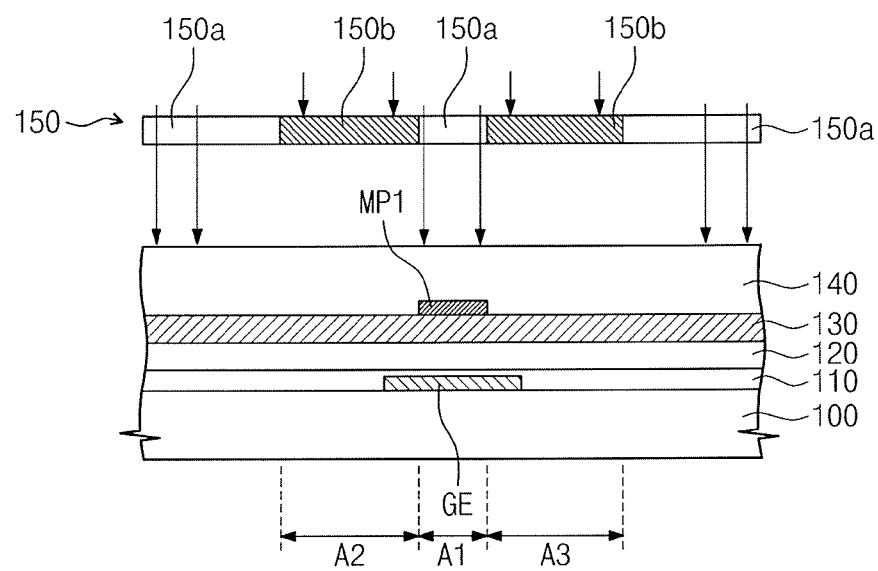
Figure 1D:
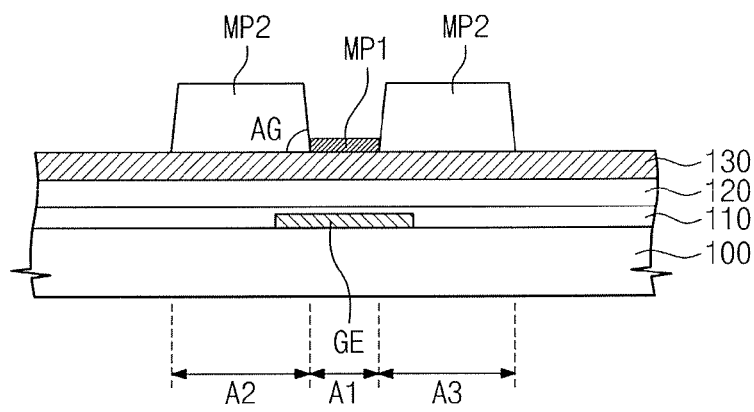

Referring to FIGS. 1C and 1D, a first photosensitive film 140 may be formed to cover the first mask pattern MP1, and then, a binary mask 150 may be disposed on the first photosensitive film 140. In an embodiment, the first photosensitive film 140 may be formed of, for example, a positive photosensitive material.

The binary mask 150 may include, for example, optically-transparent regions 150a and light-blocking regions 150b. The optically-transparent regions 150a may be configured to allow light to transmit therethrough, and the light-blocking regions 150b may be configured to prevent light from transmitting therethrough. The binary mask 150 may be disposed in such a way that the light-blocking regions 150b are positioned on a second region A2 and a third region A3 of the active layer 120, and that the optically-transparent regions 150a are positioned on the remaining regions of the active layer 120 other than the second and third regions A2 and A3.

Thereafter, an exposure process may be performed to the first photosensitive film 140 using, for example, the binary mask 150 as a photomask. For example, during the exposure process, light may be irradiated onto some regions of the first photosensitive film 140 through the optically-transparent regions 150a, while the remaining regions of the first photosensitive film 140 corresponding to the light-blocking regions 150b may not be irradiated by the light.

After the exposure process, a developing process may be performed on the first photosensitive film 140. As the result of the developing process, the irradiated regions of the first photosensitive film 140 may be removed, and a second mask pattern MP2 may be formed on the metal layer 130.

In an example embodiment, the first photosensitive film 140 and the second mask pattern MP2 may be formed of, for example, the positive photosensitive material, as described above, while the first mask pattern MP1 may be formed of, for example, a negative photosensitive material. Accordingly, it is possible to prevent the first mask pattern MP1 from being developed in the developing process or by developing solution for developing the first photosensitive film 140.

Alternatively, in an example embodiment, the first photosensitive film 140 and the second mask pattern MP2 may be formed of, for example, a negative photosensitive material, and the first mask pattern MP1 may be formed of, for example, a positive photosensitive material. Also, in an example embodiment, the first mask pattern MP1 may be formed of or contain, for example, an organic or metal material, and in this case, it is possible to prevent the first mask pattern MP1 from being developed by developing solution for developing the first photosensitive film 140.

In an embodiment, the second mask pattern MP2 may be formed to have, for example, a side surface that is at an angle to the top surface of the substrate 100. For example, a profile angle AG between the side surface of the second mask pattern MP2 and the top surface of the substrate 100 may be an acute angle of 50 degrees or larger.

Figure 1E:
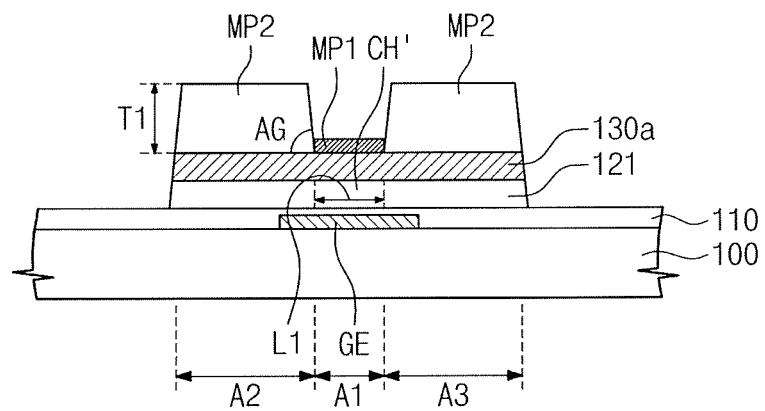
Figure 1F:
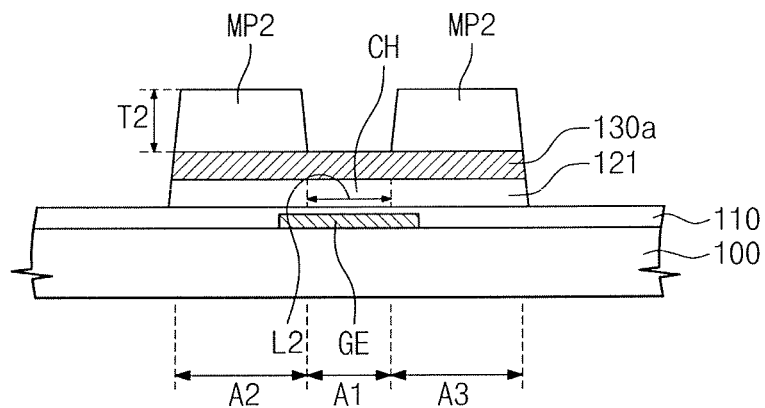
Figure 1G:
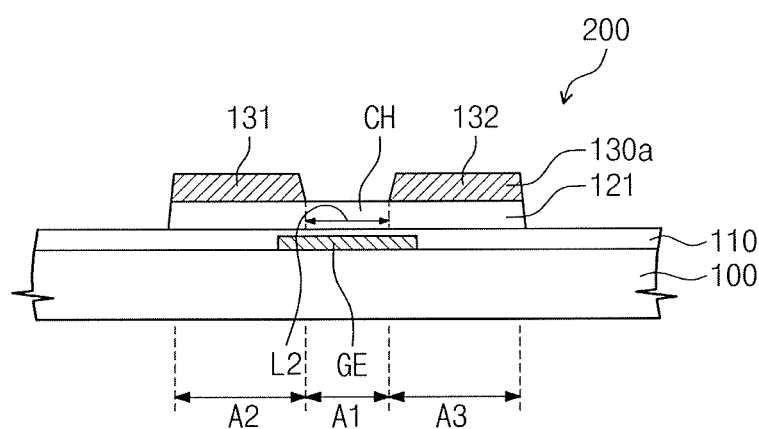

Referring to FIGS. 1E, 1F, and 1G, the metal layer 130 and the active layer 120 may be patterned using, for example, the first and second mask patterns MP1 and MP2 as an etch mask. Accordingly, a metal pattern 130a and an active pattern 121 may be formed on the first to third regions A1, A2, and A3.

Thereafter, the first mask pattern MP1 may be removed, and thus, a portion of the metal pattern 130a may be exposed on the first region A1.

In an embodiment, the removal of the first mask pattern MP1 may be performed, in an etch-back manner, using, for example, an ashing process. For example, the second mask pattern MP2 may be partially etched-back during the ashing process, and in this case, a thickness of the second mask pattern MP2 may be reduced by a difference between a first thickness T1 and a second thickness T2.

Thereafter, the metal pattern 130a may be etched using, for example, the second mask pattern MP2 as a mask to form a source electrode 131 and a drain electrode 132. Accordingly, a thin-film transistor including the gate electrode GE, the active pattern 121, the source electrode 131, and the drain electrode 132 may be formed and a fabrication of a display substrate 200 may be finished.

A provisional channel region CH' formed in the active pattern 121 may have, for example, a first channel length L1, before the etch-back process is performed to the second mask pattern MP2, and the channel region CH formed in the active pattern 121 may have a second channel length L2, after the etch-back process is performed to the second mask pattern MP2. In this case, as described above, the second mask pattern MP2 may be etched-back to have the second thickness T2 smaller than the first thickness T1. Further, as the profile angle AG is an acute angle larger than 50 degrees, the second channel length L2 may be longer than the first channel length L1.

Further, the larger the profile angle AG, the smaller a difference between the first and second channel lengths L1 and L2. That is, in the case where the profile angle AG is increased, it may be relatively easy to reduce the difference between the first and second channel lengths L1 and L2.

For example, in the case of a comparative example, in which the profile angle AG is 30 degrees and the second mask pattern MP2 is etched back to have a thickness reduced by 100 angstroms, the difference between the first and second channel lengths L1 and L2 of the channel region CH may be about 350 angstroms. By contrast, if the profile angle AG is an acute angle larger than 50 degrees, like the present embodiment of the inventive concept, the difference between the first and second channel lengths L1 and L2 can be controlled to be less than about 150 angstroms, even when the second mask pattern MP2 is etched back by 100 angstroms.

As a result, if the method according to example embodiments of the inventive concept is used to form the active pattern 121, it is possible to suppress or prevent the difference between the first and second channel lengths L1 and L2 from being increased depending on the etch-back thickness of the second mask pattern MP2. Further, in the case where a plurality of the second mask patterns MP2 are used to form a plurality of the active patterns 121 on the substrate 100, it is possible to reduce a variation in channel length of the plurality of the active layers 120, even if the etch-back thicknesses of the second mask patterns MP2 are different from each other. The operating characteristics of the thin film transistors are uniform.

Figure 2:
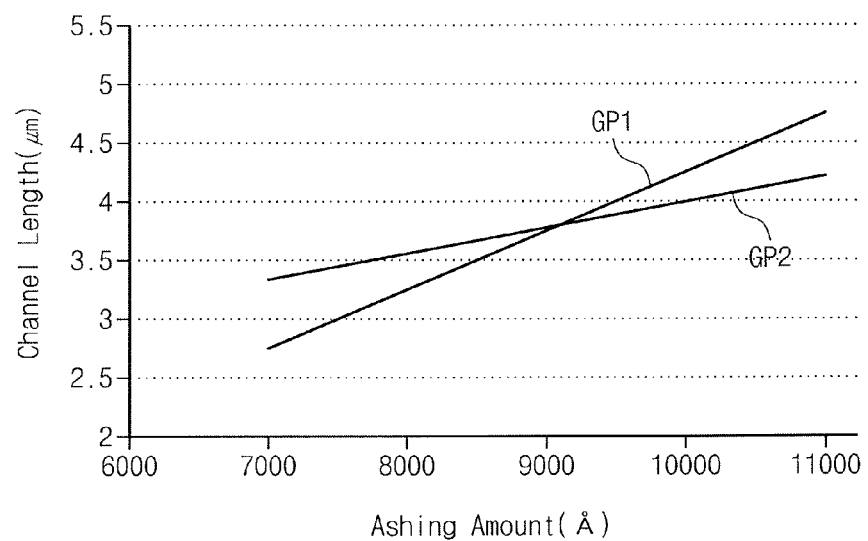
FIG. 2 is a graph showing a relationship between a channel length of a thin-film transistor and an aching amount of a second mask pattern shown in FIGS. 1E and 1F.

FIG. 2 is a graph showing a relationship between a channel length of a thin-film transistor and an ashing amount of a second mask pattern shown in FIGS. 1E and 1F. Referring to FIGS. 1E and 2, a first graph GP1 shows a relationship between an ashing amount (e.g., an etch-back amount of the second mask pattern MP2) and a channel length of a transistor, in a comparative example or in the case where the second mask pattern MP2 has a profile angle AG of about 20 degrees. A second graph GP2 shows the relationship between the ashing amount and the channel length, in an example embodiment of the inventive concept or in the case where the second mask pattern MP2 has a profile angle AG of about 55 degrees.

It is further noted that in a case where the second mask pattern MP2 has a profile angle AG of 90 degrees, the channel length may be constant regardless of any change in the ashing amount.

As shown in FIG. 2, a slope of the first graph GP1 was larger than a slope of the second graph GP2. This means that the larger the profile angle AG of the second mask pattern MP2, the smaller an increase in the channel length. Accordingly, in the case where, like example embodiments of the inventive concept, a binary mask is used to form the second mask pattern MP2 and the second mask pattern MP2 is formed to have an acute profile angle AG of 50 degrees or higher, it is possible to prevent the channel length from increasing.

By contrast to example embodiments of the inventive concept, in the case where the second mask pattern MP2 is formed using a halftone or slit mask with light-blocking regions, semi-transparent regions, and transparent regions, it may be difficult to define precisely an amount of light to be incident into a boundary between two adjacent ones of the light-blocking region, the semi-transparent region, and the optically-transparent region, and thus, the profile angle AG of the second mask pattern MP2 may be less than about 50 degrees. In this case, an increase in the channel length may be dependent on an ashing amount in the etch-back process to the second mask pattern MP2, compared with example embodiments of the inventive concept, and thus, it may be difficult to control uniformly the channel length.

Figure 3:
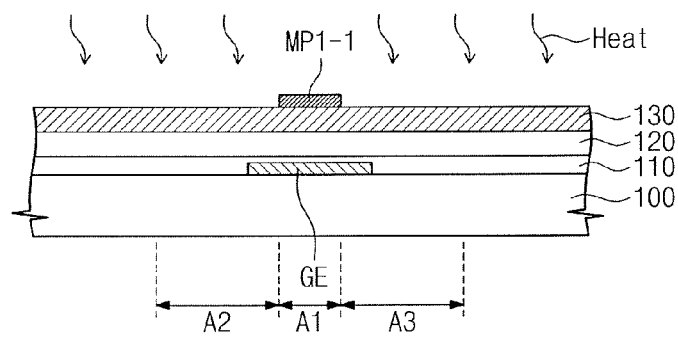
FIG. 3 is a sectional view illustrating a method of fabricating a display substrate, according to an example embodiment of the inventive concept.

FIG. 3 is a sectional view illustrating a method of fabricating a display substrate, according to an example embodiment of the inventive concept.

Referring to FIG. 3, in the present embodiment, a first mask pattern MP1-1 may be formed of, for example, the same material as the first photosensitive film 140 (e.g., of FIG. 1C). Further, the first mask pattern MP1-1 may be, for example, cured by a thermal process to have a different property from the first photosensitive film 140. For example, the curing may lead to a reduction in a developing rate of the first mask pattern MP1-1, when the first photosensitive film 140 is developed to form the second mask pattern MP2 (e.g., of FIG. 1D). In an embodiment, the first mask pattern MP1-1 may not be developed during such a developing process.

The second mask pattern (e.g., MP2 of FIG. 1D) may be needed to remain in a subsequent process (for example, after the aching process of etching the first mask pattern MP1-1), and thus, the second mask pattern (e.g., MP2 of FIG. 1D) may be formed to have a thickness larger than a thickness of the first mask pattern MP1-1.

Figure 4A:
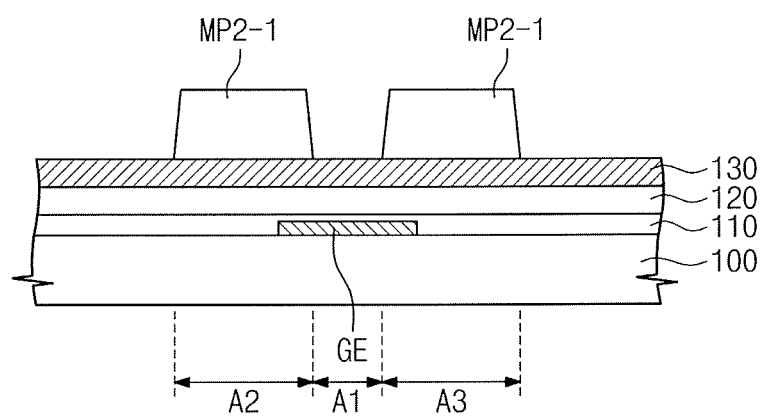
FIGS. 4A through 4B are sectional views illustrating a method of fabricating a display substrate, according to an example embodiment of the inventive concept.
Figure 4B:
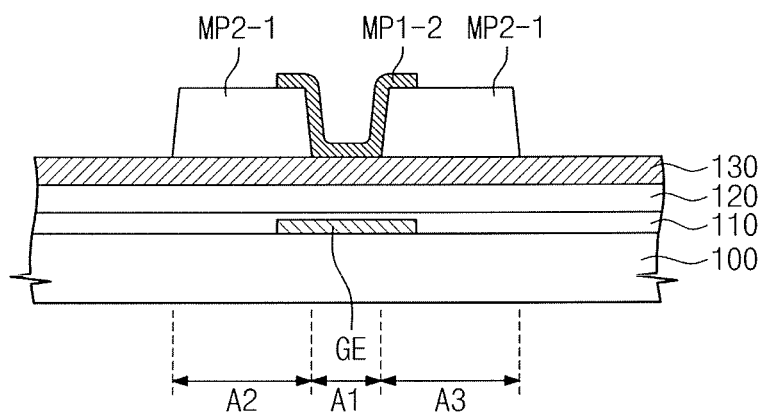

FIGS. 4A through 4B are sectional views illustrating a method of fabricating a display substrate, according to an example embodiment of the inventive concept. In the following description of FIGS. 4A and 4B, a previously described element may be identified by a similar or identical reference number without repeating an overlapping description thereof, for the sake of brevity.

Referring to FIGS. 4A and 4B, a second mask pattern MP2-1 may be formed on the metal layer 130. The second mask pattern MP2-1 may be formed using, for example, a binary mask. After the formation of the second mask pattern MP2-1, a first mask pattern MP1-2 may be printed. For example, the first mask pattern MP1-2 may be formed by a gravure printing method or a roll-coating printing method. The first mask pattern MP1-2 may be printed to cover a portion of the metal layer 130 on the first region A1 and a portion of the second mask pattern MP2-1 adjacent to the first region A1.

In other words, unlike the previous method described with reference to FIGS. 1A through 1G, the second mask pattern MP2-1 may be formed, and then, the first mask pattern MP1-2 may be formed. The first and second mask patterns MP1-2 and MP2-1 may be used to form the thin-film transistor on the substrate 100, and this process may be similar to that of the previous method described with reference to FIGS. 1E through 1G, and thus, description thereof will be omitted for the sake of brevity.

Figure 5:
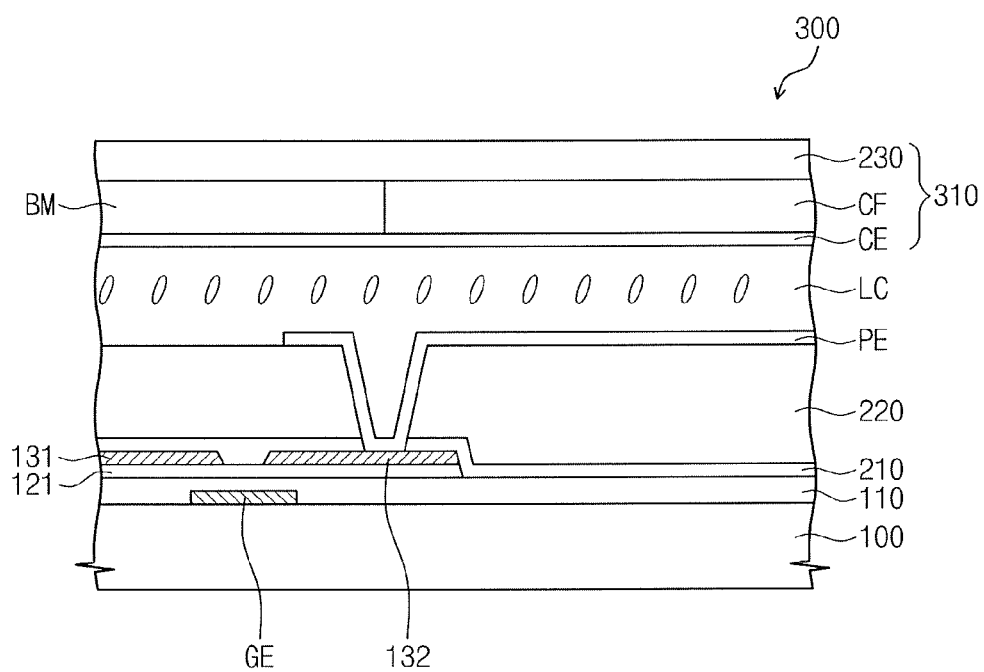
FIG. 5 is a sectional view illustrating a liquid crystal display device, in which the display substrate described with reference to FIGS. 1A through 1G is provided.

FIG. 5 is a sectional view illustrating a liquid crystal display device, in which the display substrate described with reference to FIGS. 1A through 1G is provided. In the following description of FIG. 5, a previously described element may be identified by a similar or identical reference number without repeating an overlapping description thereof, for the sake of brevity.

Referring to FIG. 5, a thin-film transistor including the gate electrode GE, the gate insulating layer 110, the active pattern 121, the source electrode 131, and the drain electrode 132 may be formed, and then, a first insulating layer 210 and a second insulating layer 220 may be formed to cover the thin-film transistor. A contact hole may be formed through the first and second insulating layer 210 and 220 to expose a portion of the drain electrode 132. The formation of the contact hole may include, for example, a photolithography process. Thereafter, a pixel portion (e.g., a pixel electrode PE in the present embodiment) may be formed to be in contact with the drain electrode 132. The pixel electrode PE may be made of, for example, a transparent conductive material such as indium tin oxide (ITO), indium zinc oxide (IZO), aluminum zinc oxide (AZO), cadmium tin oxide (CTO), or a combination thereof.

A counter substrate 310 may be disposed to face the substrate 100. A liquid crystal layer LC may be formed between the counter substrate 310 and the substrate 100. The counter substrate 310 may be formed to include, for example, a base substrate 230, a color filter CF, a black matrix BM, and a common electrode CE. The base substrate 230 may be made of, for example, transparent glass, quartz, plastic, or the like. Further, in an exemplary embodiment, the base substrate 230 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The color filter CF may be formed, for example, on the base substrate 230 to face the pixel electrode PE. The black matrix BM may be formed, for example, on the base substrate 230 and beside the color filter CF to prevent light from being incident into an adjacent pixel. The color filter CF may include a coloring material allowing each pixel to display, for example, red, green, or blue. The common electrode CE may be formed on, for example, the base substrate 230 provided with the color filter CF and the black matrix BM. The common electrode CE may be made of, for example, a transparent conductive material such as indium tin oxide (ITO), indium zinc oxide (IZO), aluminum zinc oxide (AZO), cadmium tin oxide (CTO), or a combination thereof.

The common electrode CE may be disposed to face the pixel electrode PE, and thus, it may be used to produce an electric field across the liquid crystal layer LC. Accordingly, a liquid crystal display device 300 may be fabricated.

Figure 6:
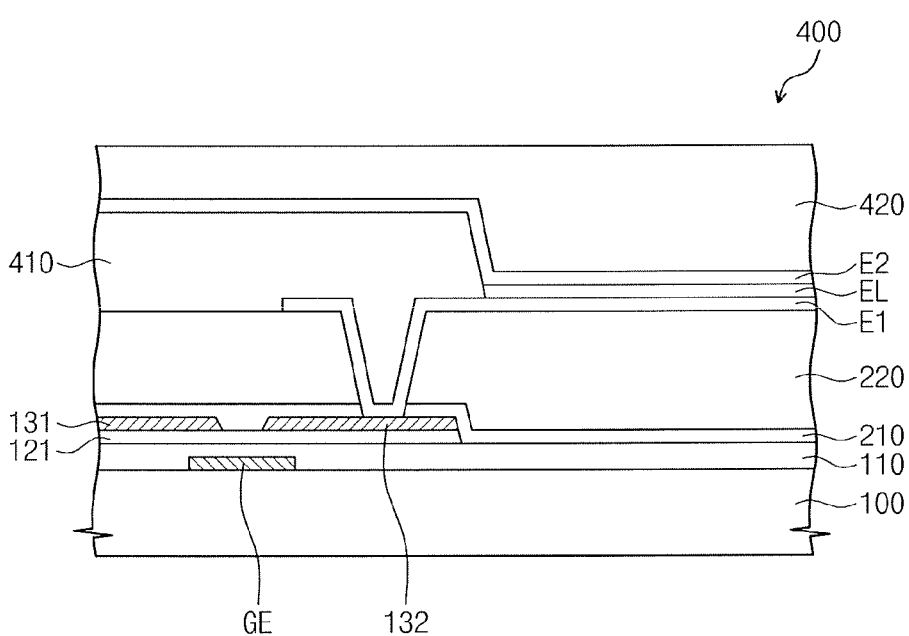
FIG. 6 is a sectional view illustrating an organic electroluminescence display device, in which the display substrate described with reference to FIGS. 1A through 1G is provided.

FIG. 6 is a sectional view illustrating an organic electroluminescence display device, in which the display substrate described with reference to FIGS. 1A through 1G is provided. In the following description of FIG. 6, a previously described element may be identified by a similar or identical reference number without repeating an overlapping description thereof, for the sake of brevity.

Referring to FIG. 6, a first electrode E1 may be formed on the substrate 100 provided with the second insulating layer 220. The first electrode E1 may be connected to the drain electrode 132 through the contact hole in the first and second insulating layer 210 and 220. The first electrode E1 may serve as, for example, an anode, and the first electrode E1 may be, for example, a transparent conductive layer (e.g., of indium tin oxide (ITO), indium zinc oxide (IZO), cadmium tin oxide (CTO), aluminum zinc oxide (AZO), indium tin zinc oxide (ITZO), cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO)).

An organic light-emitting layer EL may be formed on the first electrode E1. For example, according to the present embodiment, the organic light-emitting layer EL may be provided to have a single layer structure, and the organic light-emitting layer EL may be configured to emit white light. Alternatively, in an embodiment, the organic light-emitting layer EL may include, for example, a plurality of sub organic light-emitting layers, which may be spaced apart from each other to emit color lights.

A second electrode E2 may be formed on the organic light-emitting layer EL. A pixel-defining layer 410 may be formed on the second insulating layer 220. The second electrode E2 may be formed of, for example, indium tin oxide, indium zinc oxide, cadmium tin oxide (CTO), aluminum zinc oxide (AZO), indium tin zinc oxide (ITZO), cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). An opening may be formed in the pixel-defining layer 410, and thus, the organic light-emitting layer EL may be in contact with the first electrode E1 through the opening. The pixel defining layer 410 may be formed of, for example, one or more organic materials selected from benzocyclobutene, polyimide, polyamide (PA), acrylic resin, and phenolic resin.

For example, in an example embodiment, a hole injection layer and a hole transport layer may be further formed between the organic light-emitting layer EL and the first electrode E1, and an electron transport layer and an electron injection layer may be further formed between the organic light-emitting layer EL and the second electrode E2.

The second electrode E2 may serve as, for example, a cathode and be provided to have a single layer structure. In addition, for example, an encapsulation substrate 420 may be provided after the formation of the second electrode E2. Accordingly, an organic electroluminescence display device 400 may be fabricated.

The encapsulation substrate 420 may be provided to cover or encapsulate components of organic electroluminescence display device 400 (e.g., the organic light-emitting layer EL), thereby preventing gas or moisture from being infiltrated into the organic light-emitting layer EL from the outside. Alternatively, in an example embodiment, an encapsulation layer may be provided in place of the encapsulation substrate 420, and in this case, the encapsulation layer may cover components disposed on the substrate 100 and thereby prevent gas or moisture from being infiltrated into the organic light-emitting layer EL from the outside.

According to example embodiments of the inventive concept, a method of fabricating a display substrate may include forming a mask pattern with a controlled profile angle. The mask pattern may be used in a patterning process for forming an active pattern from an active layer. Accordingly, it is possible to prevent a channel length of the active pattern from being changed depending on a shape of the mask pattern. As a result, even in the case where a plurality of thin-film transistors are formed on the display substrate, it is possible to reduce relatively easily a variation in channel length of the active patterns of the thin-film transistors. In other words, it is possible to increase the uniformity in operation characteristics of the thin-film transistors.

Having described example embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A method of fabricating a display substrate, comprising:
   forming a gate electrode on a substrate;
   forming a gate insulating layer to cover the gate electrode;
   forming an active layer on the gate insulating layer;
   forming a metal layer on the active layer;
   forming a first mask pattern on the metal layer to face a first region of the active layer;
   forming a second mask pattern on the metal layer to face a second region and a third region of the active layer;
   etching the metal layer and the active layer using the first and second mask patterns as an etch mask to form a metal pattern and an active pattern;
   removing the first mask pattern; and
   etching the metal pattern using the second mask pattern as an etch mask to form a source electrode and a drain electrode.

2. The method of claim 1, wherein the second mask pattern is formed after the first mask pattern is formed, and
   the forming of the second mask pattern comprises:
   forming a first photosensitive film to cover the first mask pattern;
   exposing the first photosensitive film with a binary mask including an optically-transparent region and a light-blocking region; and
   developing the exposed first photosensitive film using a developing solution,
   wherein the first mask pattern and the first photosensitive film are formed of different materials from each other, such that the first mask pattern is prevented from being developed by the developing solution in the developing of the exposed first photosensitive film.

3. The method of claim 2, wherein the first mask pattern is formed using a printing process.

4. The method of claim 2, wherein a profile angle between a side surface of the second mask pattern and the substrate is an acute angle of no less than 50 degrees, when viewed in sectional view.

5. The method of claim 2, wherein one of the first and second mask patterns is formed of a negative photosensitive material and the other of the first and second mask patterns is formed of a positive photosensitive material.

6. The method of claim 1, wherein the first mask pattern and the second mask pattern are formed of the same material as each other, and
   the method further comprises curing the first mask pattern to make a difference in ashing rate between the first and second mask patterns.

7. The method of claim 6, wherein the second mask pattern is formed to be thicker than the first mask pattern.

8. The method of claim 1, wherein the first mask pattern is formed after the second mask pattern is formed, and
   the forming of the second mask pattern comprises:
   forming a first photosensitive film on the substrate provided with the metal layer;
   exposing the first photosensitive film with a binary mask including an optically-transparent region and a light-blocking region; and
   developing the exposed first photosensitive film using a developing solution.

9. A method of fabricating a display device, comprising:
   forming a display substrate; and
   combining a counter substrate to the display substrate,
   wherein the forming of the display substrate comprises:
   forming a gate electrode on a substrate;
   forming a gate insulating layer to cover the gate electrode;
   forming an active layer on the gate insulating layer;
   forming a metal layer on the active layer;
   forming a first mask pattern on the metal layer to face a first region of the active layer;
   forming a second mask pattern on the metal layer to face a second region and a third region of the active layer;
   etching the metal layer and the active layer using the first and second mask patterns as an etch mask to form a metal pattern and an active pattern;
   removing the first mask pattern;
   etching the metal pattern using the second mask pattern as an etch mask to form a source electrode and a drain electrode; and
   forming a pixel portion connected to a thin-film transistor including the gate electrode, the active pattern, the source electrode, and the drain electrode.

10. The method of claim 9, wherein the second mask pattern is formed after the first mask pattern is formed, and
    the forming of the second mask pattern comprises:
    forming a first photosensitive film to cover the first mask pattern;
    exposing the first photosensitive film with a binary mask including an optically-transparent region and a light-blocking region; and
    developing the exposed first photosensitive film using a developing solution,
    wherein the first mask pattern and the first photosensitive film are formed of different materials from each other, such that the first mask pattern is prevented from being developed by the developing solution in the developing of the exposed first photosensitive film.

11. The method of claim 10, wherein the first mask pattern is formed using a printing process.

12. The method of claim 10, wherein a profile angle between a side surface of the second mask pattern and the substrate is an acute angle of no less than 50 degrees, when viewed in sectional view.

13. The method of claim 10, wherein one of the first and second mask patterns is formed of a negative photosensitive material and the other of the first and second mask patterns is formed of a positive photosensitive material.

14. The method of claim 9, wherein the first mask pattern and the second mask pattern are formed of the same material as each other, and
the method further comprises curing the first mask pattern to make a difference in ashing rate between the first and second mask patterns.

15. The method of claim 14, wherein the second mask pattern is formed to be thicker than the first mask pattern.

16. The method of claim 9, wherein the first mask pattern is formed after the second mask pattern is formed, and
the forming of the second mask pattern comprises:
forming a first photosensitive film on the substrate provided with the metal layer;
exposing the first photosensitive film with a binary mask including an optically-transparent region and a light-blocking region; and
developing the exposed first photosensitive film using a developing solution.

17. The method of claim 9, further comprising forming a liquid crystal layer between the display and counter substrates,
wherein the forming of the pixel portion comprises forming a pixel electrode electrically connected to the thin-film transistor.

18. The method of claim 9, wherein the forming of the pixel portion comprises:
forming a first electrode electrically connected to the thin-film transistor;
forming an organic light-emitting layer on the first electrode; and
forming a second electrode on the organic light-emitting layer.

19. A method of fabricating a display substrate, comprising:
forming a gate electrode on a substrate;
forming a gate insulating layer to cover the gate electrode;
forming an active layer having a first region, a second region and a third region on the gate insulating layer;
forming a metal layer on the active layer;
forming a first mask pattern on the metal layer to face the first region of the active layer using a printing process;
forming a second mask pattern having a first thickness on the metal layer to face the second region and the third region of the active layer, wherein a profile angle between a side surface of the second mask pattern and the substrate is an acute angle of no less than 50 degrees, when viewed in sectional view;
etching the metal layer and the active layer using the first and second mask pattern as an etch mask to form a metal pattern and an active pattern on the first region, the second region and the third region, wherein the active pattern includes a provisional channel region having a first channel length;
removing the first mask pattern thereby exposing a portion of the metal pattern on the first region; and
etching the metal pattern using the second mask pattern as an etch mask to form a source electrode and a drain electrode, wherein the etched second mask pattern has a second thickness smaller than the first thickness, and wherein as a result of the etching of the metal pattern, the active pattern includes a channel region having a second channel length which is greater than the first channel length.

20. The method of claim 19, wherein the printing process for forming the first mask pattern comprises:
providing an printing system including an ink supplying device, a gravure roll and a blanket roll;
supplying ink from the ink supplying device into a dent or groove of the gravure roll to form an ink segment in the dent or groove;
transferring the ink segment from the gravure roll onto the blanket roll by rolling the gravure roll; and
transferring the ink segment from the blanket roll onto the metal layer by rolling the blanket roll to thereby form the first mask pattern.

* * * * *